(12) United States Patent
Matsuura et al.

(10) Patent No.: US 10,178,768 B2
(45) Date of Patent: Jan. 8, 2019

(54) MOUNTING SUBSTRATE, METHOD FOR MANUFACTURING A MOUNTING SUBSTRATE, AND MOUNTED STRUCTURE INCLUDING AN ELECTRONIC COMPONENT

(71) Applicant: ROHM CO., LTD., Kyoto (JP)

(72) Inventors: Katsuya Matsuura, Kyoto (JP); Hiroshi Tamagawa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 12 days.

(21) Appl. No.: 15/360,573

(22) Filed: Nov. 23, 2016

(65) Prior Publication Data

US 2017/0164472 A1 Jun. 8, 2017

(30) Foreign Application Priority Data

Dec. 2, 2015 (JP) ................... 2015-235911

(51) Int. Cl.
| | | |
|---|---|---|
| H05K 1/11 | (2006.01) | |
| H05K 1/18 | (2006.01) | |
| H05K 3/00 | (2006.01) | |
| H05K 3/28 | (2006.01) | |
| H05K 3/34 | (2006.01) | |

(52) U.S. Cl.
CPC ............ *H05K 1/111* (2013.01); *H05K 1/181* (2013.01); *H05K 3/0023* (2013.01); *H05K 3/287* (2013.01); *H05K 3/3442* (2013.01); *H05K 3/3452* (2013.01); *H05K 3/28* (2013.01); *H05K 2201/099* (2013.01); *H05K 2201/09036* (2013.01); *H05K 2201/0989* (2013.01); *H05K 2201/1003* (2013.01); *H05K 2201/10015* (2013.01); *H05K 2201/10022* (2013.01); *H05K 2201/10166* (2013.01); *H05K 2201/10174* (2013.01); *H05K 2201/10636* (2013.01); *Y02P 70/611* (2015.11); *Y02P 70/613* (2015.11)

(58) Field of Classification Search
CPC ...... H05K 1/111; H05K 3/0023; H05K 3/287; H05K 1/181; H05K 2201/10166; H05K 2201/10174; H05K 2201/1003; H05K 2201/10022; H05K 2201/09036; H05K 2201/10015
See application file for complete search history.

(56) References Cited

U.S. PATENT DOCUMENTS

| | | | | |
|---|---|---|---|---|
| 7,005,750 | B2 * | 2/2006 | Liu | H01L 23/49811 257/775 |
| 7,271,484 | B2 * | 9/2007 | Reiss | B23K 3/0638 257/738 |
| 9,421,628 | B2 * | 8/2016 | Higuchi | B23K 1/0008 |
| 2004/0172819 | A1 * | 9/2004 | Karasawa | H01L 21/486 29/846 |

(Continued)

*Primary Examiner* — Ishwarbhai B Patel
(74) *Attorney, Agent, or Firm* — Rabin & Berdo, P.C.

(57) ABSTRACT

A mounting substrate includes a substrate, a connection electrode, which is formed on a front surface of the substrate and on which an electronic component is mounted via a conductive bonding material, a resist film, formed on the front surface of the substrate so as to cover a peripheral edge portion of the connection electrode, and a receiving portion, formed in the resist film so as to expose a portion of the peripheral edge portion of the connection electrode and arranged to receive an excess portion of the conductive bonding material.

10 Claims, 16 Drawing Sheets

(56) References Cited

U.S. PATENT DOCUMENTS

2005/0167154 A1* 8/2005 Urano ............... H01L 23/49816
 174/250
2013/0264105 A1 10/2013 Kitamura

* cited by examiner

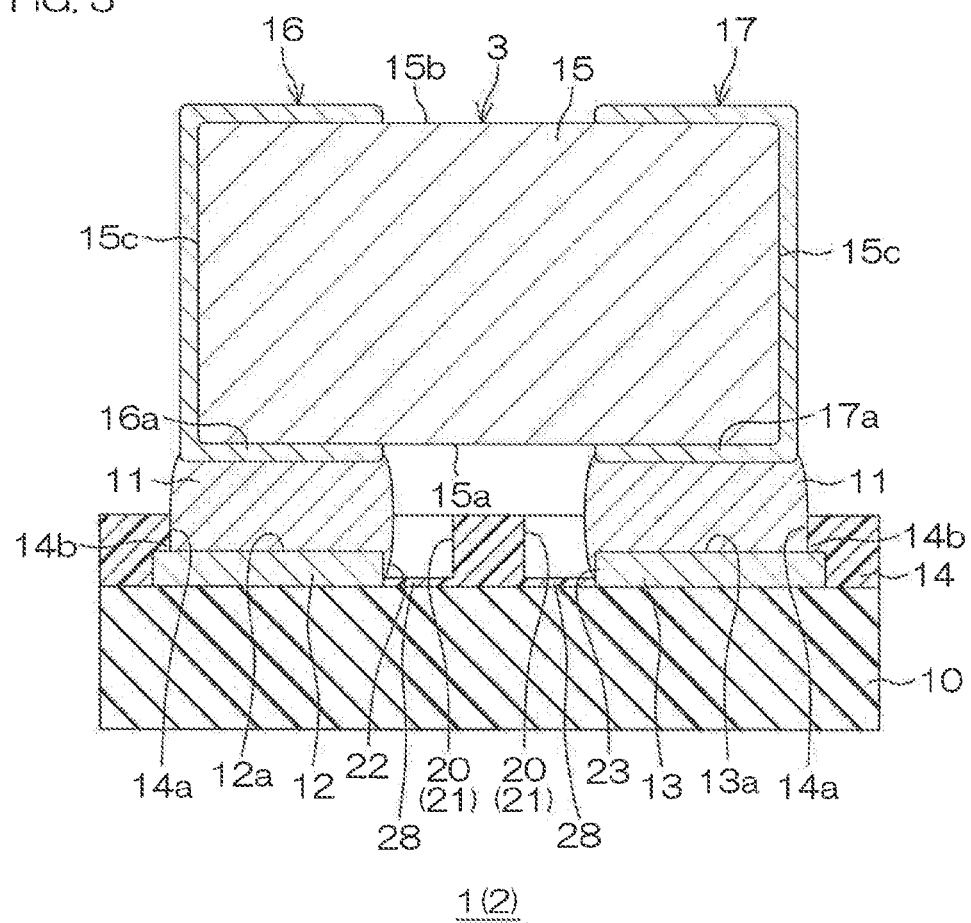

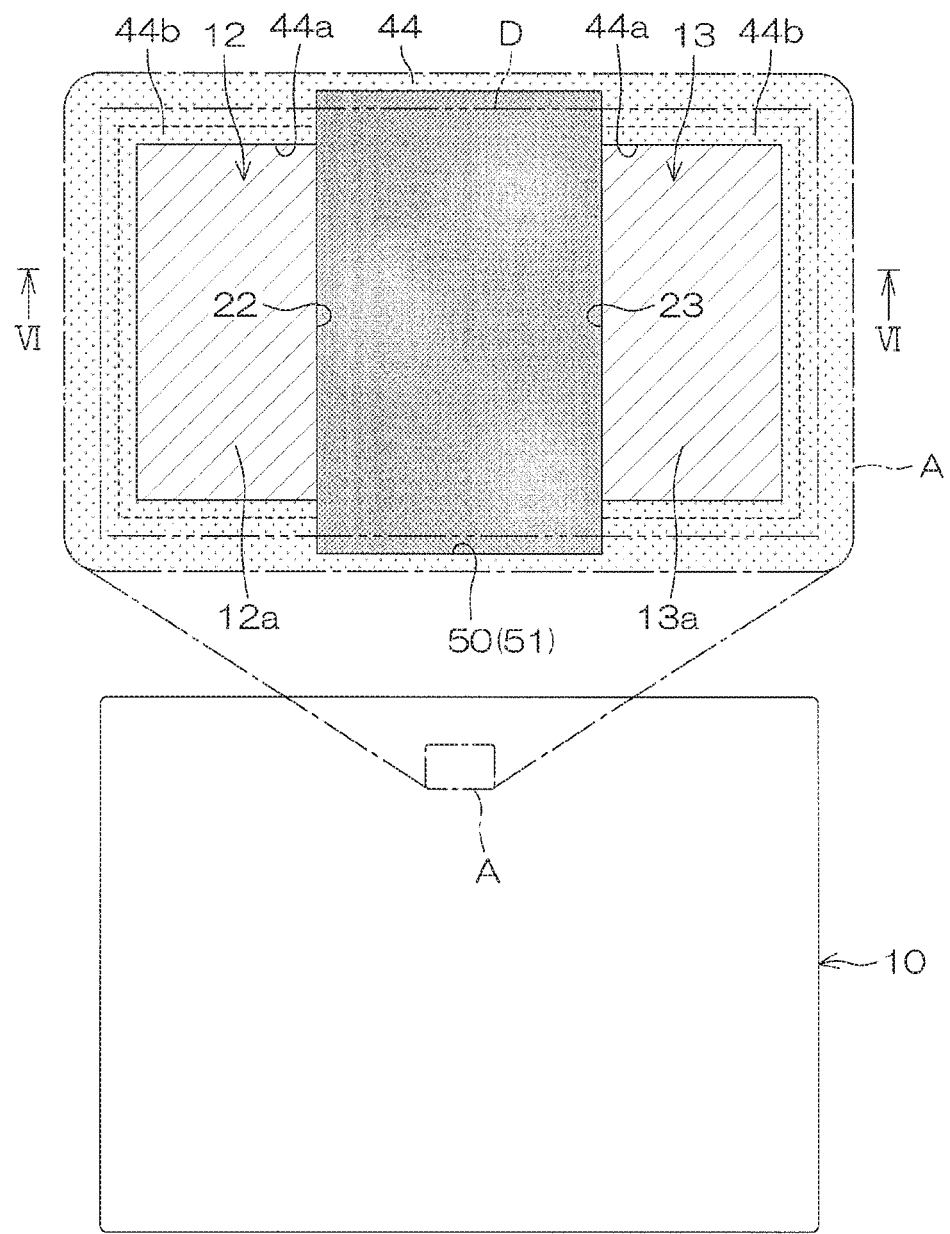

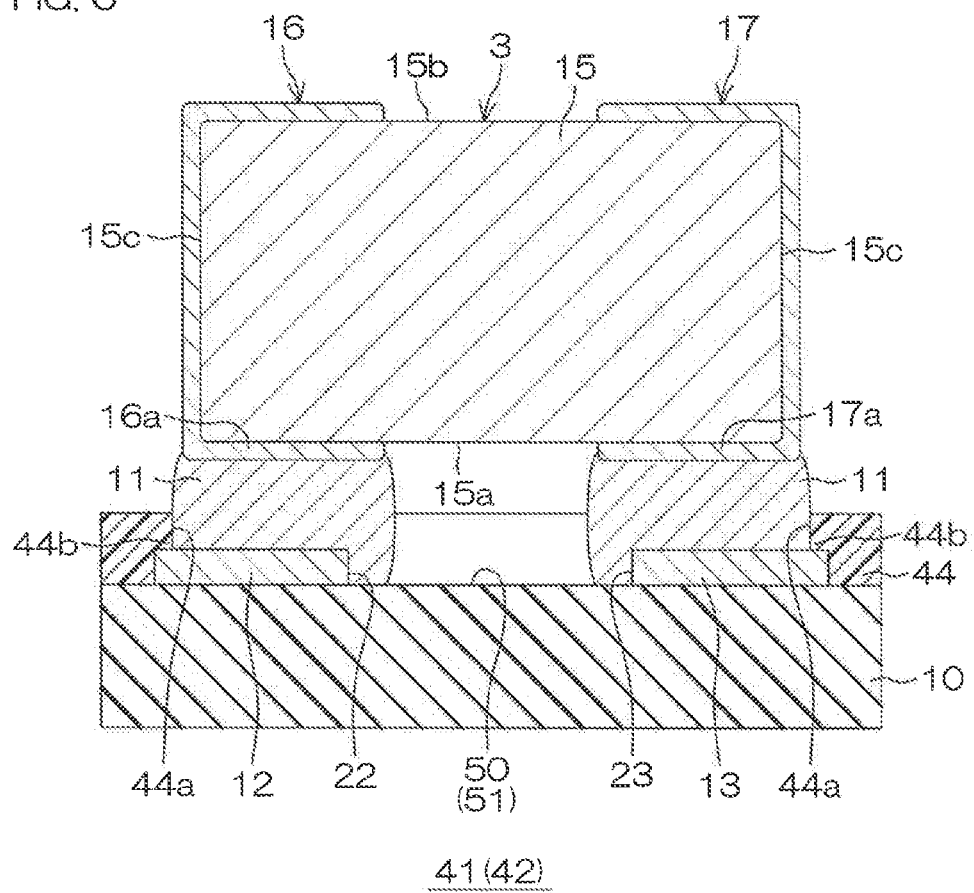

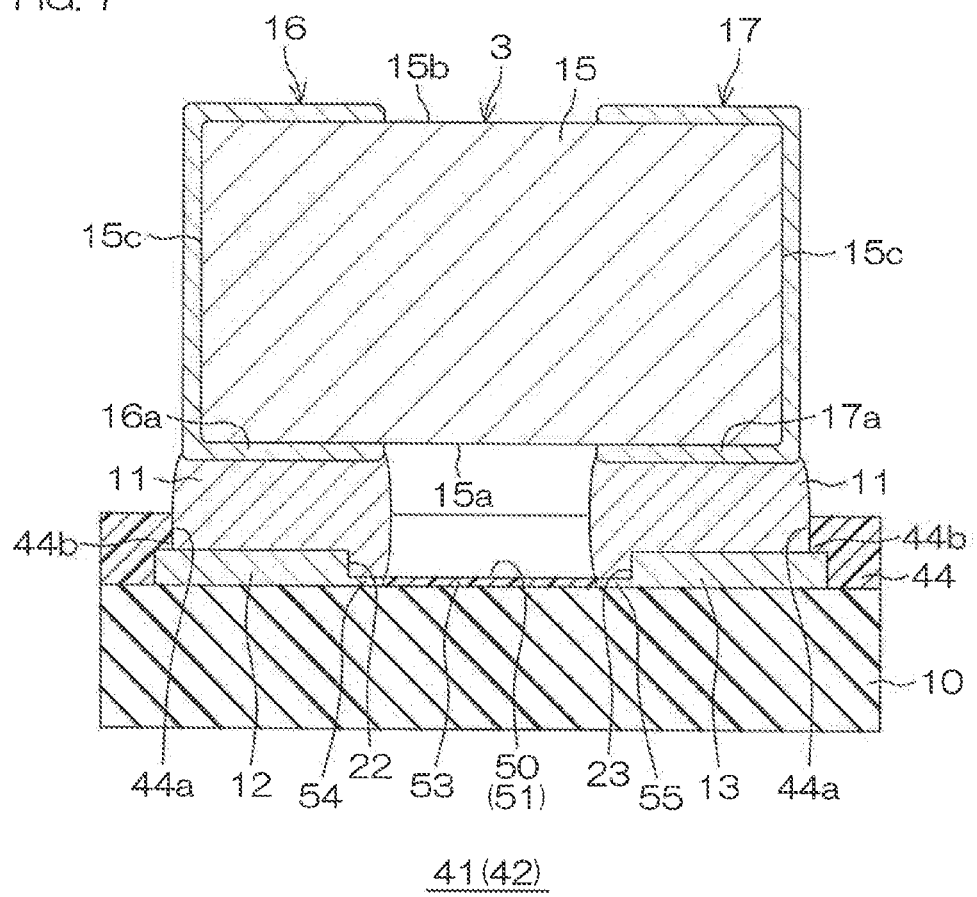

MOUNTING SUBSTRATE, METHOD FOR MANUFACTURING A MOUNTING SUBSTRATE, AND MOUNTED STRUCTURE INCLUDING AN ELECTRONIC COMPONENT

BACKGROUND OF THE INVENTION

1. Field of the Invention

The present invention relates to a mounting substrate, a method for manufacturing a mounting substrate, and a mounted structure including an electronic component.

2. Description of the Related Art

A mounting substrate, including a mounting substrate main body (substrate), a plurality of mounting pads (connection electrodes) provided on the mounting substrate main body, and a solder resist (resist film) provided on the mounting substrate main body in a manner where the plurality of mounting pads are exposed, is disclosed in US 2013264105 A1. The plurality of mounting pads include those that are entirely exposed from the solder resist and those with which a peripheral edge portion thereof is covered by solder resist.

SUMMARY OF THE INVENTION

A mounting substrate according to the present invention includes a substrate, a connection electrode, which is formed on a front surface of the substrate and on which an electronic component is mounted via a conductive bonding material, a resist film, formed on the front surface of the substrate so as to cover a peripheral edge portion of the connection electrode, and a receiving portion, formed in the resist film so as to expose a portion of the peripheral edge portion of the connection electrode and arranged to receive an excess portion of the conductive bonding material.

A mounted structure according to the present invention includes a substrate, a connection electrode, formed on a front surface of the substrate, a resist film, formed on the front surface of the substrate so as to cover a peripheral edge portion of the connection electrode, a conductive bonding material, formed on the connection electrode, a receiving portion, formed in the resist film so as to expose a portion of the peripheral edge portion of the connection electrode and arranged to receive an excess portion of the conductive bonding material, and an electronic component, connected electrically and mechanically to the connection electrode via the conductive bonding material.

The above and yet other objects, features, and effects of the present invention shall be made clear by the following description of the preferred embodiments in reference to the attached drawings.

BRIEF DESCRIPTION OF THE DRAWINGS

FIG. 3 is a vertical sectional view of a portion corresponding to FIG. 2 and is a diagram showing another example of receiving portions.

FIG. 5 is a plan view of a mounting substrate according to a second preferred embodiment of the present invention and shows a predetermined region of the mounting substrate in enlarged manner.

FIG. 6 is a vertical sectional view taken along line VI-VI shown in FIG. 5.

FIG. 7 is a vertical sectional view of a portion corresponding to FIG. 6 and is a diagram showing another example of a receiving portion.

DETAILED DESCRIPTION OF THE PREFERRED EMBODIMENTS

Figure 1:
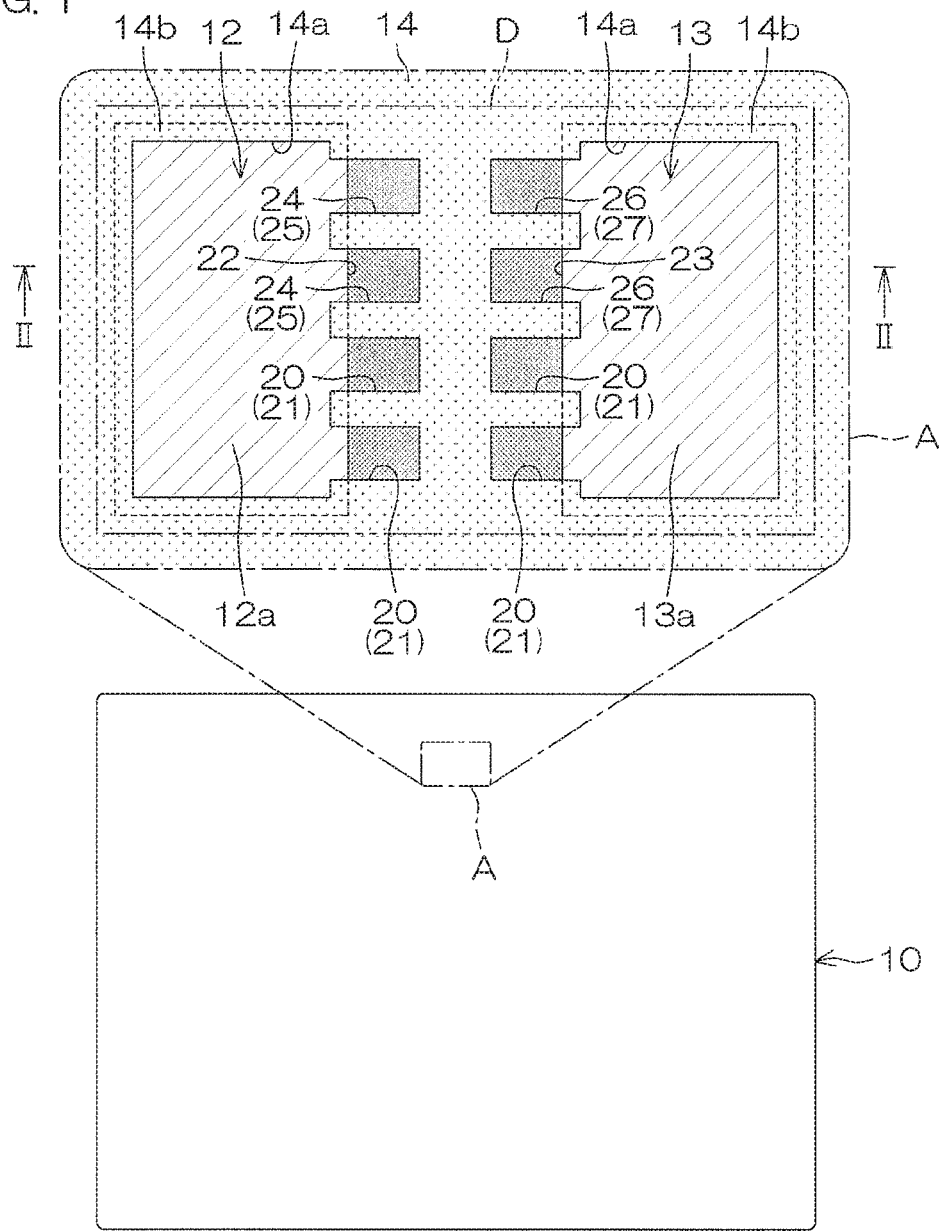
FIG. 1 is a plan view of a mounting substrate according to a first preferred embodiment of the present invention and shows a predetermined region of the mounting substrate in enlarged manner.

In the mounting substrate according to US 2013264105 A1, there is a problem that the connection electrode with which the entirety is exposed from the resist film is merely adhered to the front surface of the substrate and may thus become peeled off from the substrate due to thermal stress that arises during mounting of an electronic component, external force applied during mounting of an electronic component, etc. On the other hand, a connection electrode with which the peripheral edge portion is covered by the resist film is held between the substrate and the resist film and is therefore unlikely to become peeled off.

However, in the structure with which the peripheral edge portion of the connection electrode is covered by the resist film, there is a possibility that, due to solder or other conductive bonding material and the resist film being provided on the same connection electrode, a portion of the conductive bonding material that has melted will flow out on the resist film during mounting of an electronic component. There is thus a possibility that the electronic component will become mounted in a tilted orientation with respect to the substrate front surface as a result of fluctuation of amount of the conductive bonding material on the connection electrode. There is also a possibility that a portion of the conductive bonding material that has flowed out on the resist film will harden at a periphery of the electronic component so that a minute chip-side ball (a solder ball in a case where the conductive bonding material is solder) consist of the hardened conductive bonding material forms. These problems lead to loss of reliability of the mounting substrate and are therefore desired to be improved upon.

The present invention provides a mounting substrate and a method for manufacturing a mounting substrate with which an electronic component can be mounted in a satisfactory orientation and with which occurrence of a chip-side ball can be suppressed. The present invention also provides a mounted structure on which an electronic component is mounted.

A mounting substrate according to the present invention includes a substrate, a connection electrode, which is formed on a front surface of the substrate and on which an electronic component is mounted via a conductive bonding material, a resist film, formed on the front surface of the substrate so as to cover a peripheral edge portion of the connection electrode, and a receiving portion, formed in the resist film so as to expose a portion of the peripheral edge portion of the connection electrode and arranged to receive an excess portion of the conductive bonding material.

In the mounting substrate according to the present invention, the excess portion of the conductive bonding material can be received by the receiving portion. Therefore, flowing out of a portion of the molten conductive bonding material on the resist film can be suppressed during mounting of an electronic component. Mounting of the electronic component in a tilted orientation with respect to the front surface of the substrate can thereby be suppressed. And also formation of a chip-side ball at a periphery of the electronic component can be suppressed. The mounting substrate can thus be provided with which the electronic component can be mounted in a satisfactory orientation and with which occurrence of a chip-side ball can be suppressed.

A mounted structure according to the present invention includes a substrate, a connection electrode, formed on a front surface of the substrate, a resist film, formed on the front surface of the substrate so as to cover a peripheral edge portion of the connection electrode, a conductive bonding material, formed on the connection electrode, a receiving portion, formed in the resist film so as to expose a portion of the peripheral edge portion of the connection electrode and arranged to receive an excess portion of the conductive bonding material, and an electronic component, connected electrically and mechanically to the connection electrode via the conductive bonding material.

In the mounted structure according to the present invention, the excess portion of the conductive bonding material can be received by the receiving portion. Therefore, flowing out of a portion of the molten conductive bonding material on the resist film can be suppressed during mounting of an electronic component. Mounting of the electronic component in a tilted orientation with respect to the front surface of the substrate can thereby be suppressed. And also formation of a chip-side ball at a periphery of the electronic component can be suppressed. The mounted structure can thus be provided with which the electronic component can be mounted in a satisfactory orientation and with which occurrence of a chip-side ball can be suppressed.

Preferred embodiments of the present invention shall now be described in detail with reference to the attached drawings.

First Preferred Embodiment

Figure 2:
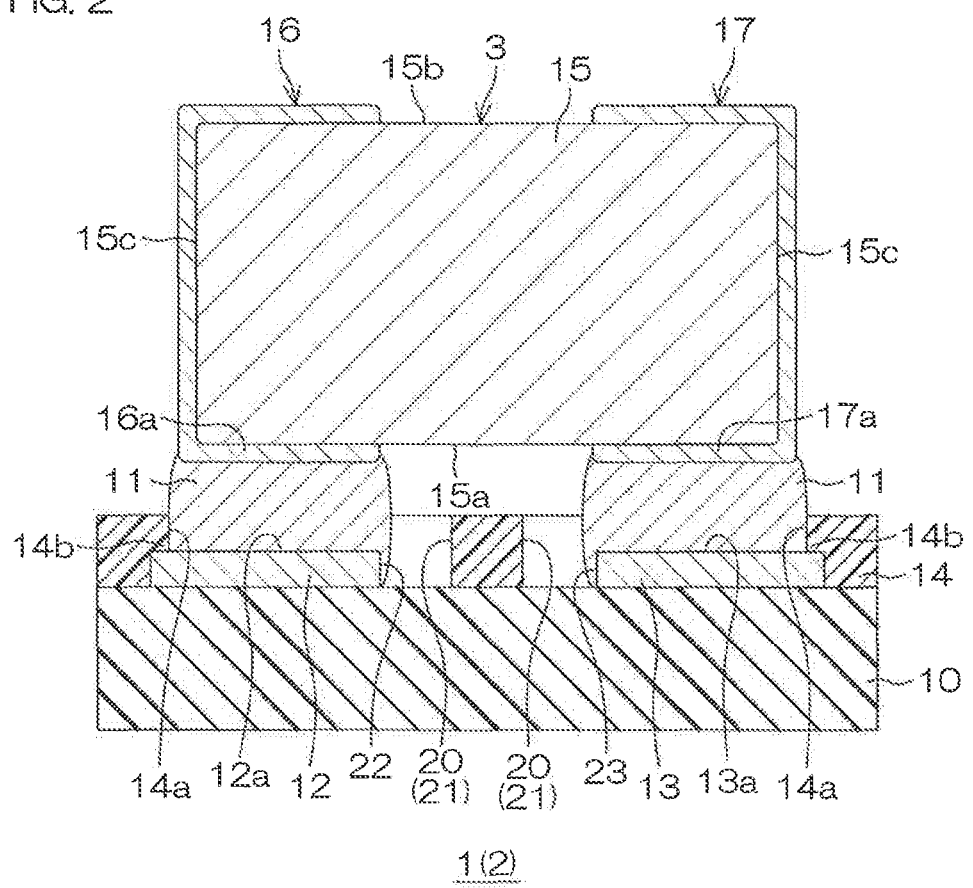
FIG. 2 is a vertical sectional view taken along line II-II shown in FIG. 1.

FIG. 1 is a plan view of a mounting substrate 1 according to a first preferred embodiment of the present invention and shows a predetermined region A of the mounting substrate 1 in enlarged manner. FIG. 2 is a vertical sectional view taken along line II-II shown in FIG. 1. A state where an electronic component 3 is not mounted on the mounting substrate 1 is shown in FIG. 1, and a state where the electronic component 3 is mounted on the mounting substrate 1 is shown in FIG. 2.

The mounting substrate 1 according to the present preferred embodiment is a printed wiring board. The mounting substrate 1 is provided as a mounted structure 2 by the electronic component 3 being mounted thereon. The mounted structure 2 is, for example, a printed circuit board or a printed circuit assembly.

The mounting substrate 1 includes a substrate 10. The substrate 10 is, for example, consist of an epoxy resin. Wiring (not shown) of a predetermined pattern is formed on a one side surface of the substrate 10 or in an interior of the substrate 10. Referring to the enlarged view of FIG. 1, a mounting region D, in which the electronic component 3 is mounted, is set to the one side surface of the substrate 10. A pair of connection electrodes 12 and 13 are formed inside the mounting region D. The electronic component 3 is mounted via a conductive bonding material 11 to be described below on the pair of connection electrodes 12 and 13. The connection electrodes 12 is electrically connected, for example, to an internal wiring (not shown) formed in a surface layer portion of the substrate 10. The connection electrodes 13 is electrically connected, for example, to an internal wiring (not shown) formed in a surface layer portion of the substrate 10. The respective connection electrodes 12 and 13 are formed to oblong shapes extending in mutually parallel directions. The respective connection electrodes 12 and 13 may contain copper.

A resist film 14 is formed on a front surface of the substrate 10. In FIG. 1, the resist film 14 is illustrated with hatching for the sake of clarity. The resist film 14 is a protective film arranged to protect the substrate 10 and the wiring pattern. The resist film 14 is formed, for example, of an organic-based insulating material, such as a photosensitive resin or a thermosetting resin, etc.

Pad openings 14a, exposing inner regions of the respective connection electrodes 12 and 13 as pad regions 12a and 13a, are formed in the resist film 14. The resist film 14 has cover portions 14b covering peripheral edge portions of the respective connection electrodes 12 and 13. The resist film 14 is formed along side surfaces of the respective connection electrodes 12 and 13 from on the front surface of the substrate 10 and covers upper surfaces of the respective connection electrodes 12 and 13. The cover portions 14b of the resist film 14 cover the respective connection electrodes 12 and 13 from four directions.

Referring to FIG. 2, the electronic component 3 mounted in the mounting region D is, for example, a small component called a chip region component and includes a chip main body 15 of rectangular parallelepiped shape. The chip main body 15 includes a pair of main surfaces 15a and 15b and side surfaces 15c connecting the pair of main surfaces 15a and 15b. One main surface 15a of the chip main body 15 is a mounting surface (hereinafter referred to as "mounting surface 15a") that faces the substrate 10 when the electronic component 3 is mounted on the substrate 10. The chip main body 15 may be formed of an insulating material, such as ceramic, etc., or may be formed of a semiconductor material, such as silicon, etc. The chip main body 15 may include a function element, such as a resistor, a capacitor, a coil, a diode, a transistor, etc.

In the present preferred embodiment, an embodiment of a case where the electronic component 3 is a chip component is illustrated. However, instead of a chip component, the electronic component 3 may be a composite function element, in which a plurality of function elements, such as a resistor, a capacitor, a coil, a diode, a transistor, etc., are combined, that is, for example, a CPU chip or a memory chip, etc., that includes an integrated circuit.

A pair of terminal electrodes 16 and 17 are formed at respective end portions in a longitudinal direction of the chip main body 15. More specifically, one terminal electrode 16 is formed at a one side end portion of the chip main body 15 in the longitudinal direction and the other terminal electrode 17 is formed at the other side end portion of the chip main body 15 in the longitudinal direction. Each of the terminal electrodes 16 and 17 is formed to cover the pair of main surfaces 15a and 15b and the side surfaces 15c of the chip main body 15.

In the respective terminal electrodes 16 and 17, portions formed at the mounting surface 15a side of the chip main body 15 are arranged as mounting electrode portions 16a and 17a to be connected to the exterior. One mounting electrode portion 16a (terminal electrode 16) is bonded via the conductive bonding material 11 to one connection electrode 12 and the other mounting electrode portion 17a (terminal electrode 17) is bonded via the conductive bonding material 11 to the other connection electrode 13. The electronic component 3 is thereby mounted on the substrate 10.

The conductive bonding material 11 may be a solder or a conductive paste material. If the conductive bonding material 11 is consist of the solder, the solder may be an alloy including two or more types of metal selected from the group that includes tin, lead, phosphorus, silver, copper, nickel, germanium, bismuth, indium, zinc, aluminum, antimony, and cobalt. The solder may be an alloy including tin and lead, an alloy including tin and phosphorus, or an alloy including tin and antimony. If the conductive bonding material 11 is consist of the conductive paste material, the conductive paste material may include gold, silver, platinum, palladium, copper, or nickel. In the present preferred embodiment, the conductive bonding material 11 includes the solder. That is, the resist film 14 according to the present preferred embodiment is formed as a solder resist film.

Referring to FIG. 1 and FIG. 2, one feature of the mounting substrate 1 according to the present preferred embodiment is that receiving portions 20 arranged to receive excess portions of the conductive bonding material 11 are formed in the resist film 14. The receiving portions 20 are also containment portions arranged to contain the excess portions of the conductive bonding material 11. The receiving portions 20 are formed by removed portions where the resist film 14 is removed so as to expose portions of the peripheral edge portions of the respective connection electrodes 12 and 13.

Referring to FIG. 2, in the case of the arrangement where the peripheral edge portions of the respective connection electrodes 12 and 13 are covered by the resist film 14, the resist film 14 and the conductive bonding material 11 are formed on the respective connection electrodes 12 and 13. Therefore, in the arrangement where the receiving portions 20 are not present, there is a possibility that a portion of the conductive bonding material 11 that has melted will flow out on the resist film 14 during mounting of the electronic component 3. There is thus a possibility that the electronic component 3 will become mounted in a tilted orientation with respect to the front surface of the substrate 10 as a result of fluctuation of amount of the conductive bonding material 11. There is also a possibility that a portion of the conductive bonding material 11 that has flowed out on the resist film 14 will harden at a periphery of the electronic component 3 so that a minute chip-side ball (a solder ball) consist of the hardened conductive bonding material 11 is formed.

Therefore, in the mounting substrate 1 according to the present preferred embodiment, the portions positioned on the peripheral edge portions of the respective connection electrodes 12 and 13 in the resist film 14 are selectively removed and the receiving portions 20 arranged to receive and contain the excess portions of the molten conductive bonding material 11 are formed. The receiving portion 20 formed at the connection electrode 12 side is formed to be in communication with the pad opening 14a at the connection electrode 12 side. And the receiving portion 20 formed at the connection electrode 13 side is formed to be in communication with the pad opening 14a at the connection electrode 13 side. More specifically, the receiving portions 20 include recess portions 21 in communication with the pad openings 14a and receive and contain the excess portions of the conductive bonding material 11 that flow out from the upper surfaces of the respective connection electrodes 12 and 13 due to melting.

Referring to FIG. 1, the receiving portions 20 are formed in the region covering between the pair of connection electrodes 12 and 13 in the resist film 14. More specifically, the receiving portions 20 are formed by removing, from among the region covering between the pair of connection electrodes 12 and 13 in the resist film 14, portions covering the peripheral edge portions of the respective connection electrodes 12 and 13, and portions covering between the pair of connection electrodes 12 and 13.

Even more specifically, the one connection electrode 12 includes a facing side surface 22 facing the other connection electrode 13, and the other connection electrode 13 includes a facing side surface 23 facing the one connection electrode 12. The receiving portions 20 include a plurality (four, in the present preferred embodiment) of first receiving portions 24 formed at the facing surface 22 side of the one connection electrode 12 and a plurality (four, in the present preferred embodiment) of second receiving portions 26 formed at the facing surface 23 side of the other connection electrode 13.

That is, the recess portions 21 in communication with the pad opening 14a at the one connection electrode 12 side include a plurality (four, in the present preferred embodiment) of first recess portions (first receiving portions 24). Also, the recess portions 21 in communication with the pad opening 14a at the other connection electrode 13 side include a plurality (four, in the present preferred embodiment) of second recess portions 27 (second receiving portions 26).

The plurality of first receiving portions 24 are formed at intervals along the facing side surface 22 of the one connection electrode 12 so as to expose peripheral edge portions of the facing side surface 22. On the other hand, the plurality of second receiving portions 26 are formed along the facing side surface 23 of the other connection electrode 13 so as to expose peripheral edge portions of the facing side surface 23. In directions in which the one connection electrode 12 and the other connection electrode 13 face each other, the resist film 14 is interposed between the first receiving portions 24 and the second receiving portions 26. In the present preferred embodiment, the first receiving portions 24 and the second receiving portions 26 are separated from each other by the resist film 14.

Referring to FIG. 2, the receiving portions 20 are formed to expose the front surface of the substrate 10. The conductive bonding material 11 includes portions positioned above exposed surfaces at which the front surface of the substrate 10 is exposed from the receiving portions 20. The conductive bonding material 11 covers the facing side surfaces 22 and 23 of the respective connection electrodes 12 and 13 above the exposed surfaces of the substrate 10 in addition to the upper surfaces of the respective connection electrodes 12 and 13. The electronic component 3 is electrically and mechanically connected to the respective connection electrodes 12 and via the conductive bonding material 11 positioned inside the receiving portions 20 and on the upper surfaces of the respective connection electrodes 12 and 13. The electrical and mechanical connections between the electronic component 3 and the respective connection electrodes 12 and 13 are thereby made satisfactory.

An arrangement shown in FIG. 3 may be adopted in place of the arrangement where the receiving portions 20 expose the front surface of the substrate 10. FIG. 3 is a vertical sectional view of a portion corresponding to FIG. 2 and is a diagram showing another example of the receiving portions 20.

Referring to FIG. 3, each receiving portion 20 includes a resist film 28 covering the front surface of the substrate 10 at its bottom portion. A thickness of each resist film 28 is less than a thickness of the resist film 14. The conductive bonding material 11 includes portions positioned above the resist films 28. The conductive bonding material 11 covers the facing side surfaces 22 and 23 of the respective connection electrodes 12 and 13 above the resist films 28 in addition to the upper surfaces of the respective connection electrodes 12 and 13. The electronic component 3 is electrically and mechanically connected to the respective connection electrodes 12 and 13 via the conductive bonding material 11 positioned inside the receiving portions 20 and on the upper surfaces of the respective connection electrodes 12 and 13. The electrical and mechanical connections between the electronic component 3 and the respective connection electrodes 12 and 13 are thereby made satisfactory.

In the present preferred embodiment, an example where a plurality of first receiving portions 24 (first recess portions 25) are formed is described. However, an arrangement where just one first receiving portion 24 (first recess portion 25) is formed may be adopted. Also, an arrangement where a relatively wide first recess portion 24 (first recess portion 25), with which a plurality of first receiving portions 24 (first recess portions 25) are integrated along the facing side surface 22, is formed may be adopted.

Also in present preferred embodiment, an example where a plurality of second receiving portions 26 (second recess portions 27) are formed is described. However, an arrangement where just one second receiving portion 26 (second recess portion 27) is formed may be adopted. Also, an arrangement where a relatively wide second recess portion 26 (second recess portion 27), with which a plurality of second receiving portions 26 (second recess portions 27) are integrated along the facing side surface 23, is formed may be adopted.

As described above, in the mounting substrate 1 according to the present preferred embodiment, the excess portion of the conductive bonding material 11 can be received by the receiving portions 20. Therefore, flowing out of a portion of the molten conductive bonding material 11 on the resist film 14 can be suppressed during mounting of the electronic component 3. Mounting of the electronic component 3 in a tilted orientation with respect to the front surface of the substrate 10 can thereby be suppressed. And also formation of a chip-side ball at a periphery of the electronic component 3 can be suppressed. The mounting substrate 1 can thus be provided with which the electronic component 3 can be mounted in a satisfactory orientation and with which occurrence of a chip-side ball can be suppressed.

A case where a chip-side ball is formed in a space between the mounting surface 15a of the electronic component 3 and the resist film 14 in a structure where the receiving portions 20 are not present shall now be considered. In this case, there is a possibility that the electronic component 3 will be lifted by the chip-side ball formed in the space between the mounting surface 15a of the electronic component 3 and the resist film 14. The chip-side ball may become a cause of the electronic component 3 being mounted in a tilted orientation.

In contrast, in the mounting substrate 1 according to the present preferred embodiment, the receiving portions 20 are formed in the region covering between the pair of connection electrodes 12 and 13 in the resist film 14. Forming of a chip-side ball in the space between the mounting surface 15a of the electronic component 3 and the resist film 14 can thus be suppressed effectively. The mounting substrate 1 can thus be provided with which the electronic component 3 can be mounted in an even more satisfactory orientation.

An example of a method for manufacturing the mounting substrate 1 shall now be described. FIG. 4A to FIG. 4H are vertical sectional views of a method for manufacturing the mounting substrate 1 shown in FIG. 1. FIG. 4A to FIG. 4H are sectional views of a portion corresponding to FIG. 2.

Figure 4A:
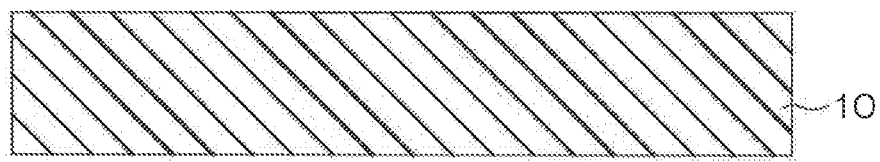
FIG. 4A is a vertical sectional view of a method for manufacturing the mounting substrate shown in FIG. 1.
Figure 4B:
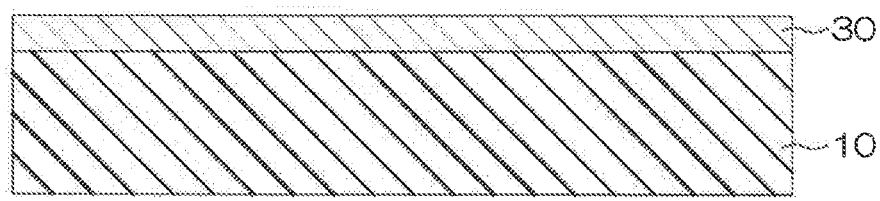
FIG. 4B is a vertical sectional view of a step subsequent to that of FIG. 4A.
Figure 4C:
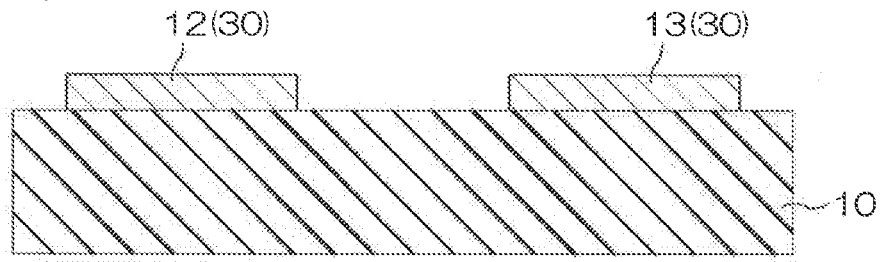
FIG. 4C is a vertical sectional view of a step subsequent to that of FIG. 4B.

Referring to FIG. 4A, first, the substrate 10, having the wiring (not shown) of the predetermined pattern formed on the front surface or in the interior thereof, is prepared. Next, with reference to FIG. 4B, a conductive material (copper in the present preferred embodiment) is deposited on the front surface of the substrate 10, for example, by a sputtering method or a plating method to form a conductive material layer 30. Next, with reference to FIG. 4C, the conductive material layer 30 is removed selectively, for example, by etching via a mask to form the pair of connection electrodes 12 and 13 of predetermined shapes.

Figure 4D:
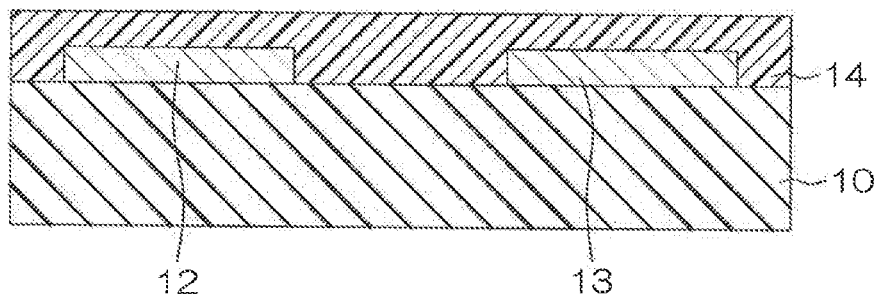
FIG. 4D is a vertical sectional view of a step subsequent to that of FIG. 4C.

Next, with reference to FIG. 4D, the resist film 14 covering the respective connection electrodes 12 and 13 is formed on the front surface of the substrate 10. The resist film 14 may be formed by adhering a resin sheet consist of a photosensitive resin onto the front surface of the substrate 10 or may be formed by coating a photosensitive resin onto the front surface of the substrate 10. The photosensitive resin may be of a negative type or a positive type.

Figure 4E:
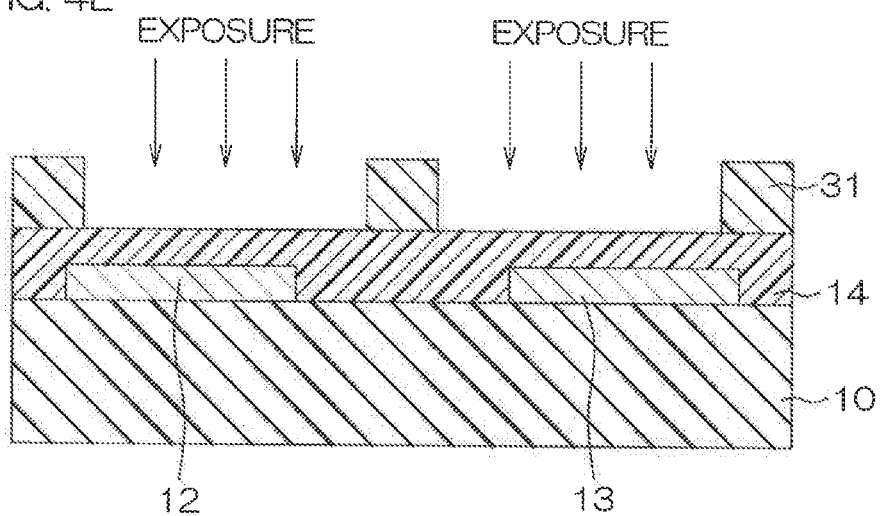
FIG. 4E is a vertical sectional view of a step subsequent to that of FIG. 4D.

Next, with reference to FIG. 4E, the resist film 14 is photo-exposed selectively in a predetermined pattern via a photomask 31, for example, by photolithography. Next, with reference to FIG. 4F, the resist film 14 is developed. The pad openings 14a, which expose partial regions of the respective connection electrodes 12 and 13 as the pad regions 12a and 13a, are thereby formed in the resist film 14. Also, the receiving portions 20 are thereby formed in the resist film 14.

Figure 4F:
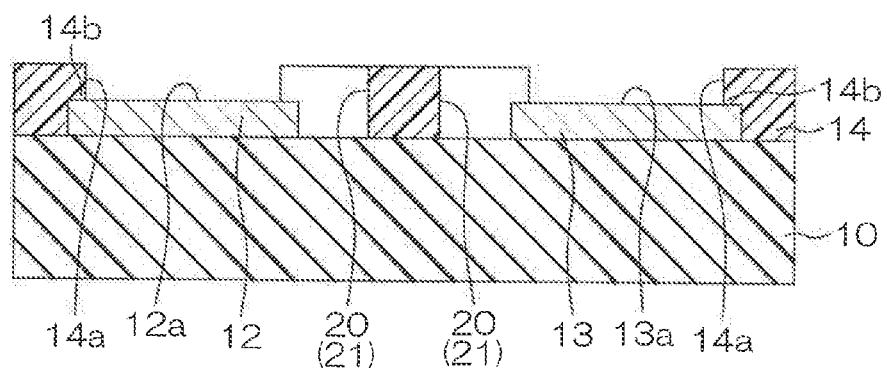
FIG. 4F is a vertical sectional view of a step subsequent to that of FIG. 4E.

In FIG. 4E and FIG. 4F, an example where the resist film 14 consist of the photosensitive resin is formed is described. However, the resist film 14 consist of a thermosetting resin may be formed. In this case, a mask of a predetermined pattern is formed on the front surface of the substrate 10 and after coating the thermosetting resin on the front surface of the substrate 10 via the mask, the thermosetting resin is thermoset. Thereafter, the mask is removed. The pad openings 14a and the receiving portions 20 may be formed in the resist film 14 by such a method as well.

Also, after forming the resist film 14 consist of any insulating material on the front surface of the substrate 10, the resist film 14 may be removed selectively by etching via a mask. The pad openings 14a and the receiving portions 20 may be formed in the resist film 14 by such a method as well.

Figure 4G:
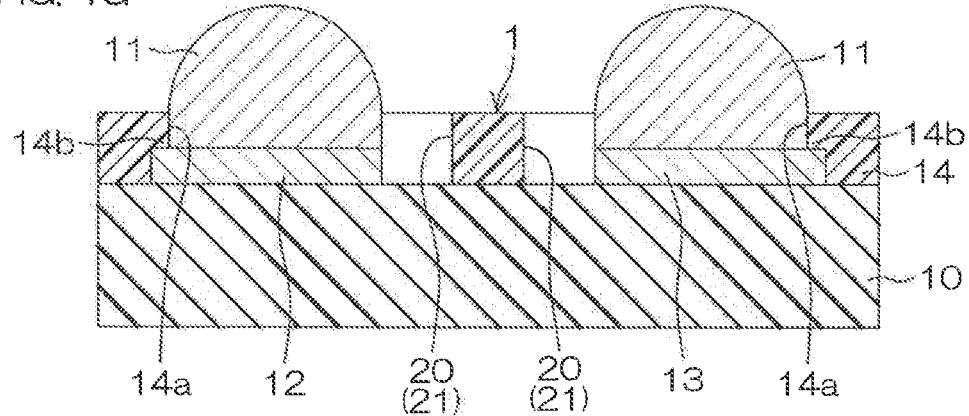
FIG. 4G is a vertical sectional view of a step subsequent to that of FIG. 4F.

Next, with reference to FIG. 4G, the conductive bonding material 11 (solder in the present preferred embodiment) is formed on the respective connection electrodes 12 and 13 exposed from the resist film 14. The conductive bonding material 11 may, for example, be formed on the respective connection electrodes 12 and 13 by the plating method. Alternatively, the conductive bonding material 11 may be formed on the respective connection electrodes 12 and 13 by a dispensing method using a known dispensing apparatus or by a screen printing method using a known printing apparatus. The mounting substrate 1 is manufactured through the processes described above.

Figure 4H:
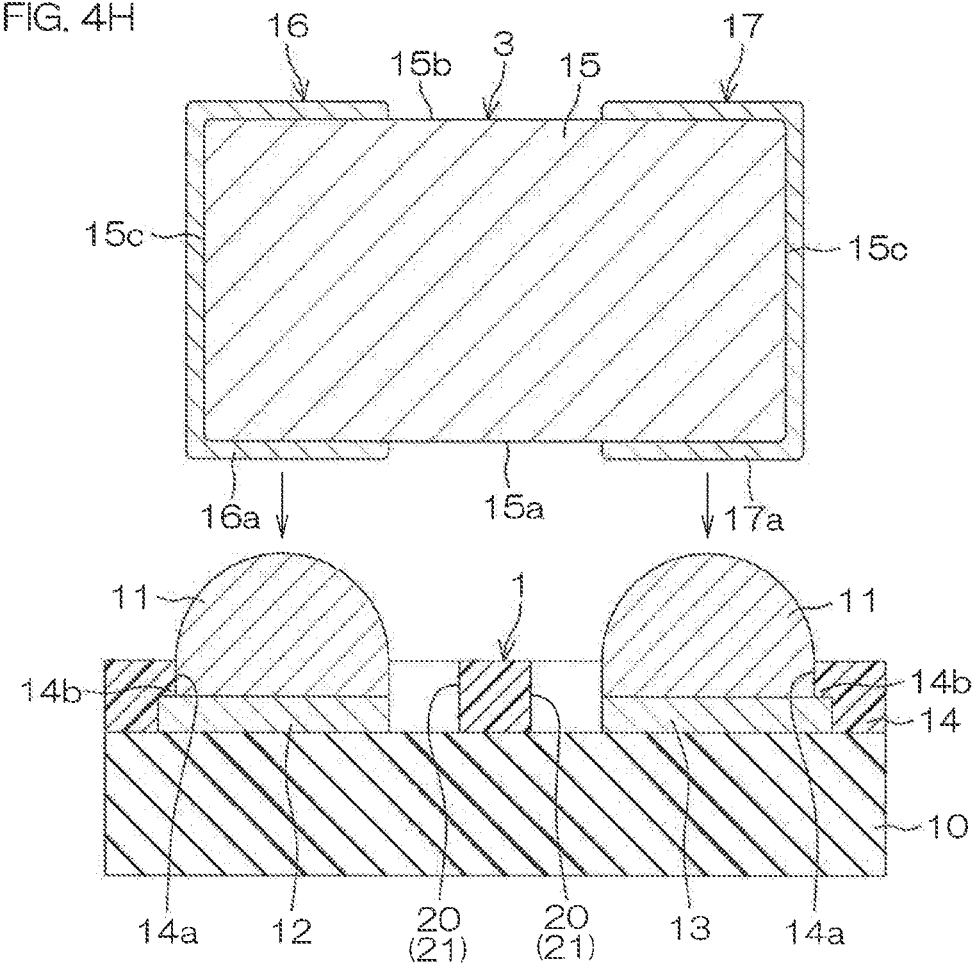
FIG. 4H is a vertical sectional view of a step subsequent to that of FIG. 4G.

Thereafter, with reference to FIG. 4H, the electronic component 3 is bonded to the respective connection electrodes 12 and 13. In this process, the one mounting electrode portion 16a (terminal electrode 16) is bonded to the one connection electrode 12 and the other mounting electrode portion 17a (terminal electrode 17) is bonded to the other connection electrode 13. The electronic component 3 is thereby mounted on the substrate 10. The mounted structure 2, with which the electronic component 3 is mounted on the mounting substrate 1, is thereby manufactured.

Although an example where the conductive bonding material 11 is formed in the process of FIG. 4G is described, the conductive bonding material 11 may be formed at the pair of mounting electrode portions 16a and 17a sides of the electronic component 3. If the conductive bonding material 11 is formed at the pair of mounting electrode portions 16a and 17a sides of the electronic component 3, the process of FIG. 4H can be performed upon skipping the process of FIG. 4G.

Second Preferred Embodiment

FIG. 5 is a plan view of a mounting substrate according to a second preferred embodiment of the present invention and shows the predetermined region A of the mounting substrate 41 in enlarged manner. FIG. 6 is a vertical sectional view taken along line VI-VI shown in FIG. 5. A state where the electronic component 3 is not mounted on the mounting substrate 41 is shown in FIG. 5, and a state where the electronic component 3 is mounted on the mounting substrate 41 is shown in FIG. 6. In FIG. 5 and FIG. 6, arrangements that are the same as the arrangements illustrated with the first preferred embodiment described above are provided with the same reference symbols and description thereof shall be omitted.

The mounting substrate 41 according to the present preferred embodiment is a printed wiring board. The mounting substrate 41 according to the present preferred embodiment is provided as a mounted structure 42 by the electronic component 3 being mounted thereon. The mounted structure 42 is, for example, a printed circuit board or a printed circuit assembly.

The mounting substrate 41 includes the substrate 10 on which the mounting region D is set. The pair of connection electrodes 12 and 13 is formed on the substrate 10. A resist film 44 is formed on the front surface of the substrate 10. In FIG. 5, the resist film 44 is illustrated with hatching for the sake of clarity. The resist film 44 is a protective film arranged to protect the front surface of the substrate 10 and the wiring pattern. The resist film 44 is formed, for example, of an organic-based insulating material, such as a photosensitive resin or a thermosetting resin, etc.

Pad openings 44a, exposing inner regions of the respective connection electrodes 12 and 13 as the pad regions 12a and 13a, are formed in the resist film 44. The resist film 44 has cover portions 44b covering the peripheral edge portions of the respective connection electrodes 12 and 13. The resist film 44 is formed along side surfaces, except the facing side surfaces 22 and 23, of the respective connection electrodes 12 and 13 from on the front surface of the substrate 10 and covers the peripheral edge portions of the respective connection electrodes 12 and 13. The cover portions 44b of the resist film 44 cover the respective connection electrodes 12 and 13 from three directions.

Referring to FIG. 6, the electronic component 3 is mounted in the mounting region D of the substrate 10. The one mounting electrode portion 16a (terminal electrode 16) is bonded via the conductive bonding material 11 to the one connection electrode 12 and the other mounting electrode portion 17a (terminal electrode 17) is bonded via the conductive bonding material 11 to the other connection electrode 13. The electronic component 3 is thereby mounted on the substrate 10.

Referring to FIG. 5 and FIG. 6, one feature of the mounting substrate 41 according to the present preferred embodiment is that a receiving portion 50 arranged to receive excess portions of the conductive bonding material 11 is formed in the resist film 44. The receiving portion 50 is also a containment portion arranged to contain the excess portions of the conductive bonding material 11. The receiving portion 50 is formed by a portion where the resist film 44 is removed so as to expose portions of the peripheral edge portions of the respective connection electrodes 12 and 13.

The receiving portion 50 formed at the one connection electrode 12 side is formed to be in communication with the pad opening 44a at the one connection electrode 12 side. And the receiving portion 50 formed at the other connection electrode 13 side is formed to be in communication with the pad opening 44a at the other connection electrode 13 side. More specifically, the receiving portion 50 includes a recess portion 51 in communication with the pad openings 44a and receives and contains the excess portions of the conductive bonding material 11 that flow out from the upper surfaces of the respective connection electrodes 12 and 13 due to melting.

The receiving portion 50 is formed in a region covering between the pair of connection electrodes 12 and 13 in the resist film 44. More specifically, the receiving portion 50 is formed by removing all of region covering between the pair of connection electrodes 12 and 13 in the resist film 44. Even more specifically, the receiving portion 50 is formed by removing, from among the region covering between the pair of connection electrodes and 13 in the resist film 44, portions covering peripheral edge portions of the respective connection electrodes 12 and 13 along the facing side surfaces 22 and 23, and portions covering the region between the pair of connection electrodes 12 and 13.

An inner wall surface of the receiving portion 50 is formed by inner wall surfaces of the resist film 44 and the facing side surfaces 22 and 23 of the respective connection electrodes 12 and 13. The inner wall surfaces of the resist film 44 and the facing side surfaces 22 and of the respective connection electrodes 12 and 13 mutually form a flat surface. The facing side surfaces 22 and 23 of the respective connection electrodes 12 and 13 are formed to be flush with respect to the inner wall surfaces of the resist film 44.

Referring to FIG. 6, the receiving portion 50 is formed to expose the front surface of the substrate 10. The conductive bonding material 11 includes portions positioned above an exposed surface at which the front surface of the substrate 10 is exposed from the receiving portion 50. The conductive bonding material 11 covers the facing side surfaces 22 and 23 of the respective connection electrodes 12 and 13 above the exposed surface of the substrate 10 in addition to the upper surfaces of the respective connection electrodes 12 and 13. The electronic component 3 is electrically and mechanically connected to the respective connection electrodes 12 and via the conductive bonding material 11 positioned inside the receiving portion 50 and on the respective connection electrodes 12 and 13. The electrical and mechanical connections between the electronic component 3 and the respective connection electrodes 12 and 13 are thereby made satisfactory.

An arrangement shown in FIG. 7 may be adopted in place of the arrangement where the receiving portion 50 exposes the front surface of the substrate 10. FIG. 7 is a vertical sectional view of a portion corresponding to FIG. 6 and is a diagram showing another example of the receiving portion 50.

Referring to FIG. 7, the receiving portion 50 includes a resist film 53 covering the front surface of the substrate 10 at its bottom portion. A thickness of the resist film 53 is less than a thickness of the resist film 44. The resist film 53 is formed integral to the resist film 44. Also, the receiving portion 50 includes a connection electrode 54 formed integral to the facing side surface 22 of the one connection electrode 12 and a connection electrode 55 formed integral to the facing side surface 23 of the other connection electrode 13. The respective connection electrodes 54 and 55 are formed at the bottom portion of the receiving portion 50. A thickness of each of the connection electrodes 54 and 55 is less than a thickness of each of the connection electrodes 12 and 13.

The conductive bonding material 11 includes portions positioned above the resist film 53 and/or above the respective connection electrodes 54 and 55. The conductive bonding material 11 covers the facing side surfaces 22 and 23 of the respective connection electrodes 12 and 13 above the respective connection electrodes 54 and 55 in addition to the upper surfaces of the respective connection electrodes 12 and 13. The electronic component 3 is therefore electrically and mechanically connected to the respective connection electrodes 12 and 13 via the conductive bonding material 11 positioned inside the receiving portion 50 and on the respective connection electrodes 12 and 13. The electrical and mechanical connections between the electronic component 3 and the respective connection electrodes 12 and 13 are thereby made satisfactory.

As described above, in the mounting substrate according to the present preferred embodiment, the excess portion of the conductive bonding material 11 can be received by the receiving portion 50. And therefore, flowing out of a portion of the molten conductive bonding material 11 on the resist film 44 can be suppressed during mounting of the electronic component 3. Mounting of the electronic component 3 in a tilted orientation with respect to the front surface of the substrate 10 can thereby be suppressed. And also, formation of a chip-side ball at the periphery of the electronic component 3 can be suppressed. The mounting substrate 41 can thus be provided with which the electronic component 3 can be mounted in a satisfactory orientation and with which occurrence of a chip-side ball can be suppressed.

A case where a chip-side ball is formed in a space between the mounting surface 15a of the electronic component 3 and the resist film 44 in a structure where the receiving portion 50 is not present shall now be considered. In this case, there is a possibility that the electronic component 3 will be lifted by the chip-side ball formed in the space between the mounting surface 15a of the electronic component 3 and the resist film 44. The chip-side ball may become a cause of the electronic component 3 being mounted in a tilted orientation.

In contrast, in the mounting substrate 41 according to the present preferred embodiment, the receiving portion 50 is formed in the region facing the mounting surface 15a of the electronic component 3 in the resist film 44. Forming of a chip-side ball in the space between the mounting surface 15a of the electronic component 3 and the resist film 44 can thus be suppressed effectively. The mounting substrate 41 can thus be provided with which the electronic component 3 can be mounted in an even more satisfactory orientation.

Next, an example of a method for manufacturing the mounting substrate 41 shall be described. FIG. 8A to FIG. 8K are vertical sectional views of a method for manufacturing the mounting substrate 41 shown in FIG. 5. FIG. 8A to FIG. 8K are sectional views of a portion corresponding to FIG. 6.

Figure 8A:
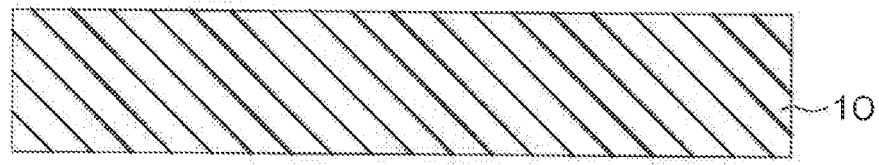
FIG. 8A is a vertical sectional view of a method for manufacturing the mounting substrate shown in FIG. 5.
Figure 8B:
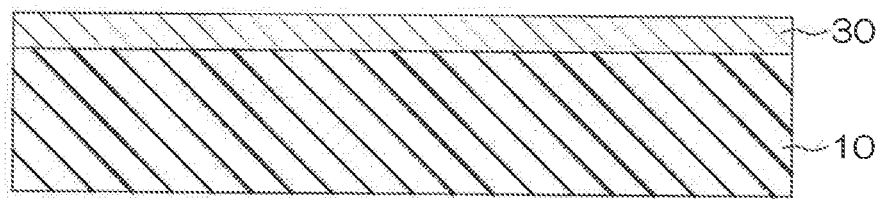
FIG. 8B is a vertical sectional view of a step subsequent to that of FIG. 8A.
Figure 8C:
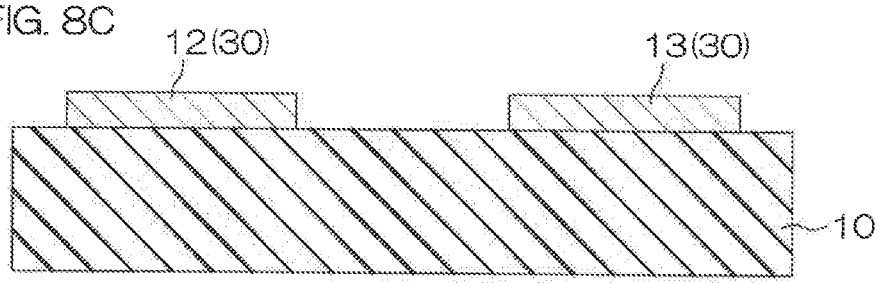
FIG. 8C is a vertical sectional view of a step subsequent to that of FIG. 8B.

Referring to FIG. 8A, first, the substrate 10, having the wiring (not shown) of the predetermined pattern formed on the front surface or at a surface layer portion thereof, is prepared. Next, with reference to FIG. 8B, a conductive material (copper in the present preferred embodiment) is deposited on the front surface of the substrate 10, for example, by the sputtering method or the plating method to form the conductive material layer 30. Next, with reference to FIG. 8C, the conductive material layer 30 is removed selectively, for example, by etching via a mask to form the pair of connection electrodes 12 and 13 of predetermined shapes.

Figure 8D:
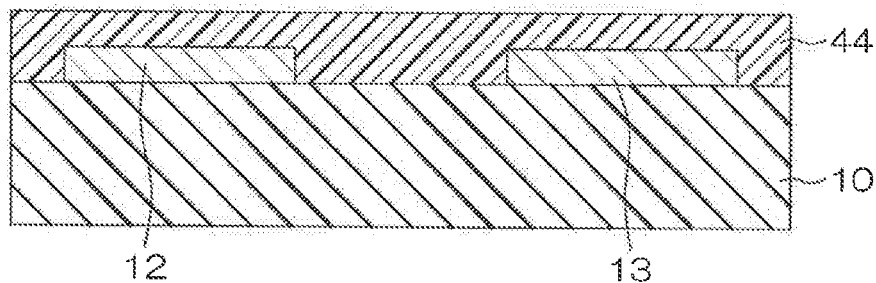
FIG. 8D is a vertical sectional view of a step subsequent to that of FIG. 8C.

Next, with reference to FIG. 8D, the resist film 44 covering the respective connection electrodes 12 and 13 is formed on the front surface of the substrate 10. The resist film 44 may be formed by adhering a resin sheet consist of a photosensitive resin onto the front surface of the substrate 10 or may be formed by coating a photosensitive resin onto the front surface of the substrate 10. The photosensitive resin may be of a negative type or a positive type.

Figure 8E:
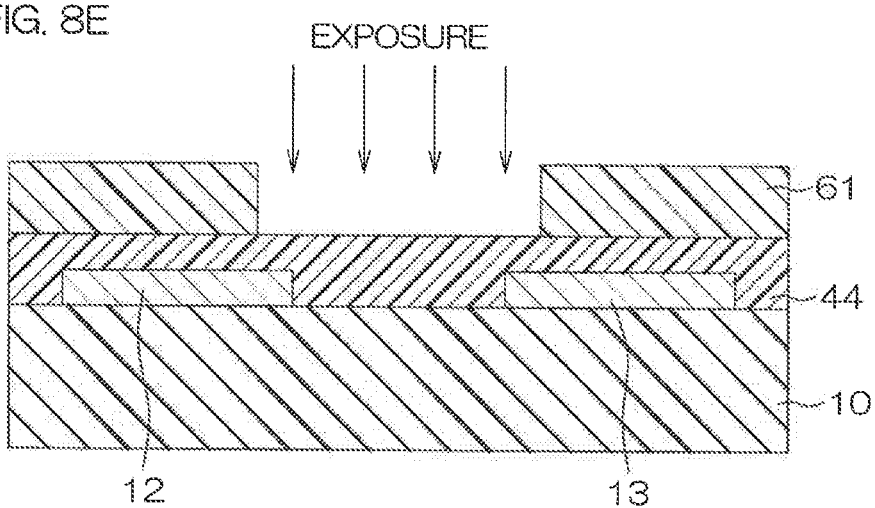
FIG. 8E is a vertical sectional view of a step subsequent to that of FIG. 8D.
Figure 8F:
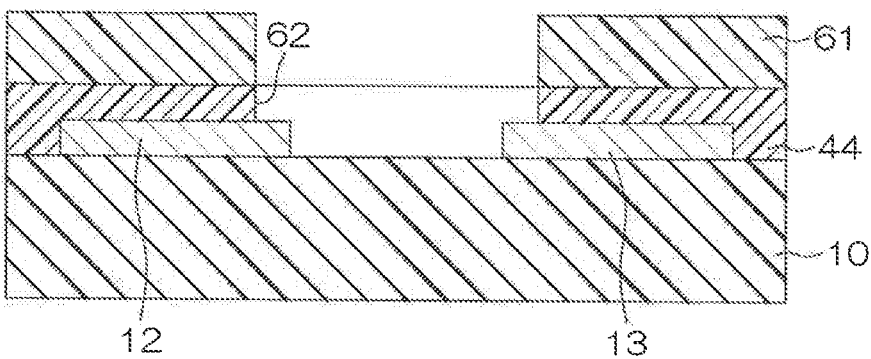
FIG. 8F is a vertical sectional view of a step subsequent to that of FIG. 8E.

Next, with reference to FIG. 8E, the resist film 44 is photo-exposed selectively in a predetermined pattern via a photomask 61, for example, by photolithography. Next, with reference to FIG. 8F, the resist film 44 is developed. An opening 62, which selectively exposes a region in which the receiving portion 50 is to be formed, is thereby formed in the resist film 44. A portion of the one connection electrode that faces the other connection electrode 13 and a portion of the other connection electrode 13 that faces the one connection electrode 12 are exposed from the opening 62.

Figure 8G:
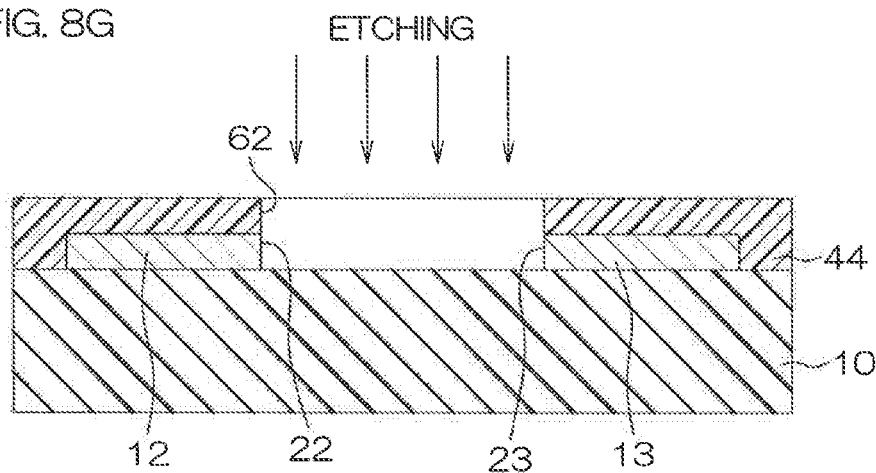
FIG. 8G is a vertical sectional view of a step subsequent to that of FIG. 8F.

Next, with reference to FIG. 8G, portions exposed from the resist film 44 in the respective connection electrodes 12 and 13 are removed by etching using the resist film 44 as a mask. The respective connection electrodes 12 and 13, having the facing side surfaces 22 and 23 that are flush with respect to the inner wall surfaces of the resist film 44, are thereby formed.

Figure 8H:
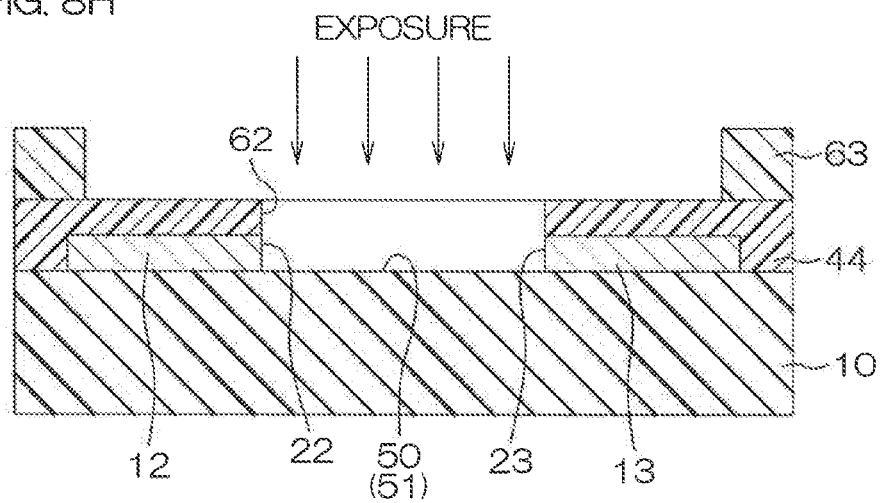
FIG. 8H is a vertical sectional view of a step subsequent to that of FIG. 8G.
Figure 8I:
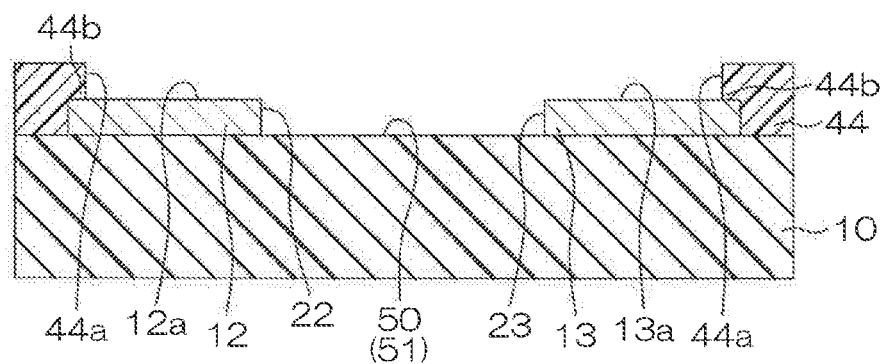
FIG. 8I is a vertical sectional view of a step subsequent to that of FIG. 8H.

Next, with reference to FIG. 8H, the resist film 44 is photo-exposed selectively in a predetermined pattern via another photomask 63, for example, by photolithography. Next, with reference to FIG. 8I, the resist film 44 is developed. The pad openings 44a, which expose partial regions of the respective connection electrodes 12 and 13 as the pad regions 12a and 13a, are thereby formed in the resist film 44. Also, the receiving portion 50 is thereby formed in the resist film 44.

In FIG. 8E to FIG. 8H, an example where the resist film 44 consist of a photosensitive resin is formed is described. However, the resist film 44 consist of a thermosetting resin may be formed instead. In this case, a mask of a predetermined pattern is formed on the front surface of the substrate 10 and after coating a thermosetting resin on the front surface of the substrate 10 via the mask, the thermosetting resin is thermoset. Thereafter, the mask is removed. The pad openings 44a and the receiving portion 50 may be formed in the resist film 44 by such a method as well.

Also, after forming the resist film 44 consist of any insulating material on the front surface of the substrate 10, the resist film 44 may be removed selectively by etching via a mask. The pad openings 44a and the receiving portion 50 may be formed in the resist film 44 by such a method as well.

Figure 8J:
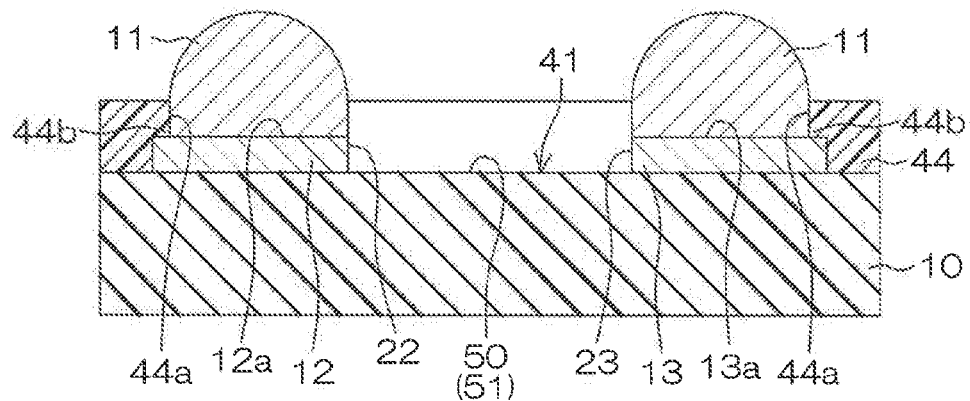
FIG. 8J is a vertical sectional view of a step subsequent to that of FIG. 8I.

Next, with reference to FIG. 8J, the conductive bonding material 11 (solder in the present preferred embodiment) is formed on the respective connection electrodes 12 and 13 exposed from the resist film 44. The conductive bonding material 11 may, for example, be formed on the respective connection electrodes 12 and 13 by the plating method. Alternatively, the conductive bonding material 11 may be formed on the respective connection electrodes 12 and 13 by a dispensing method using a known dispensing apparatus or by a screen printing method using a known printing apparatus. The mounting substrate 41 is manufactured through the processes described above.

Figure 8K:
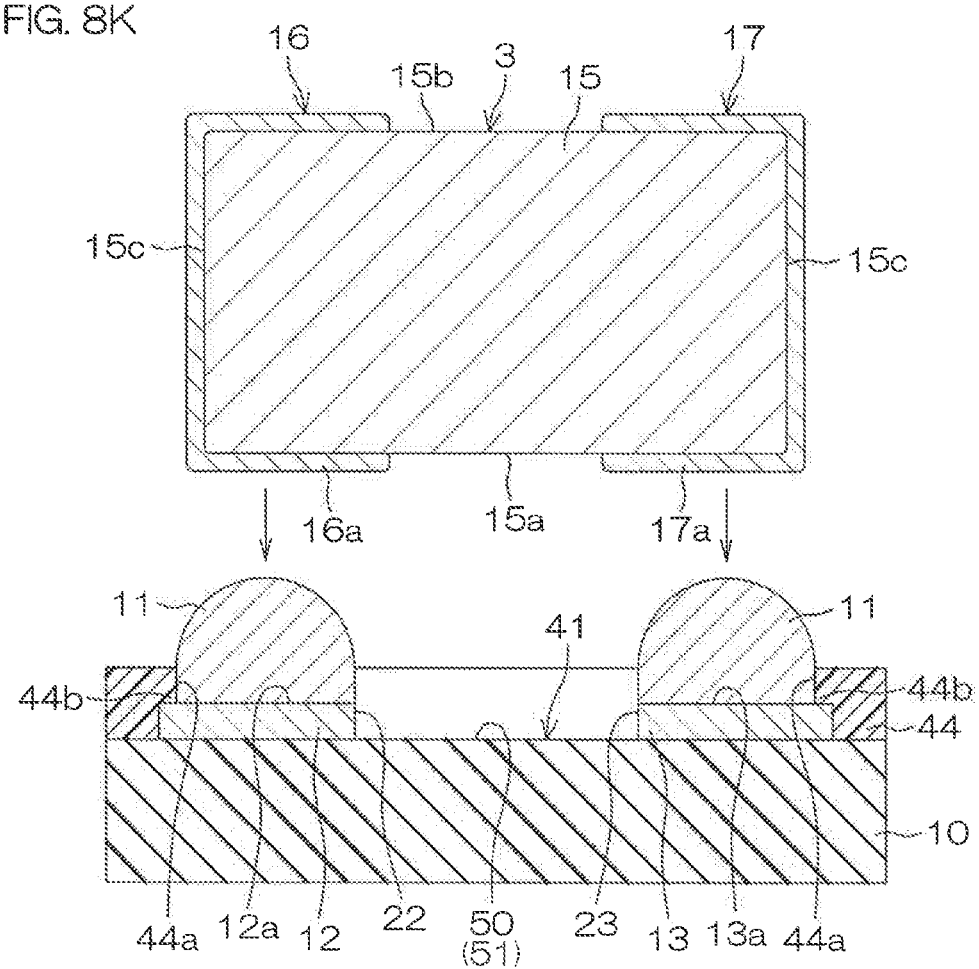
FIG. 8K is a vertical sectional view of a step subsequent to that of FIG. 8J.

Thereafter, with reference to FIG. 8K, the electronic component 3 is bonded to the respective connection electrodes 12 and 13. In this process, the one mounting electrode portion 16a (terminal electrode 16) is bonded to the one connection electrode 12 and the other mounting electrode portion 17a (terminal electrode 17) is bonded to the other connection electrode 13. The electronic component 3 is thereby mounted on the substrate 10. The mounted structure 42, with which the electronic component 3 is mounted on the mounting substrate 41, is thereby manufactured.

Although an example where the conductive bonding material 11 is formed in the process of FIG. 8J is described, the conductive bonding material 11 may be formed at the pair of mounting electrode portions 16a and 17a sides of the electronic component 3. If the conductive bonding material 11 is formed at the pair of mounting electrode portions 16a and 17a sides of the electronic component 3, the process of FIG. 8K is performed upon skipping the process of FIG. 8J.

Third Preferred Embodiment

Figure 9:
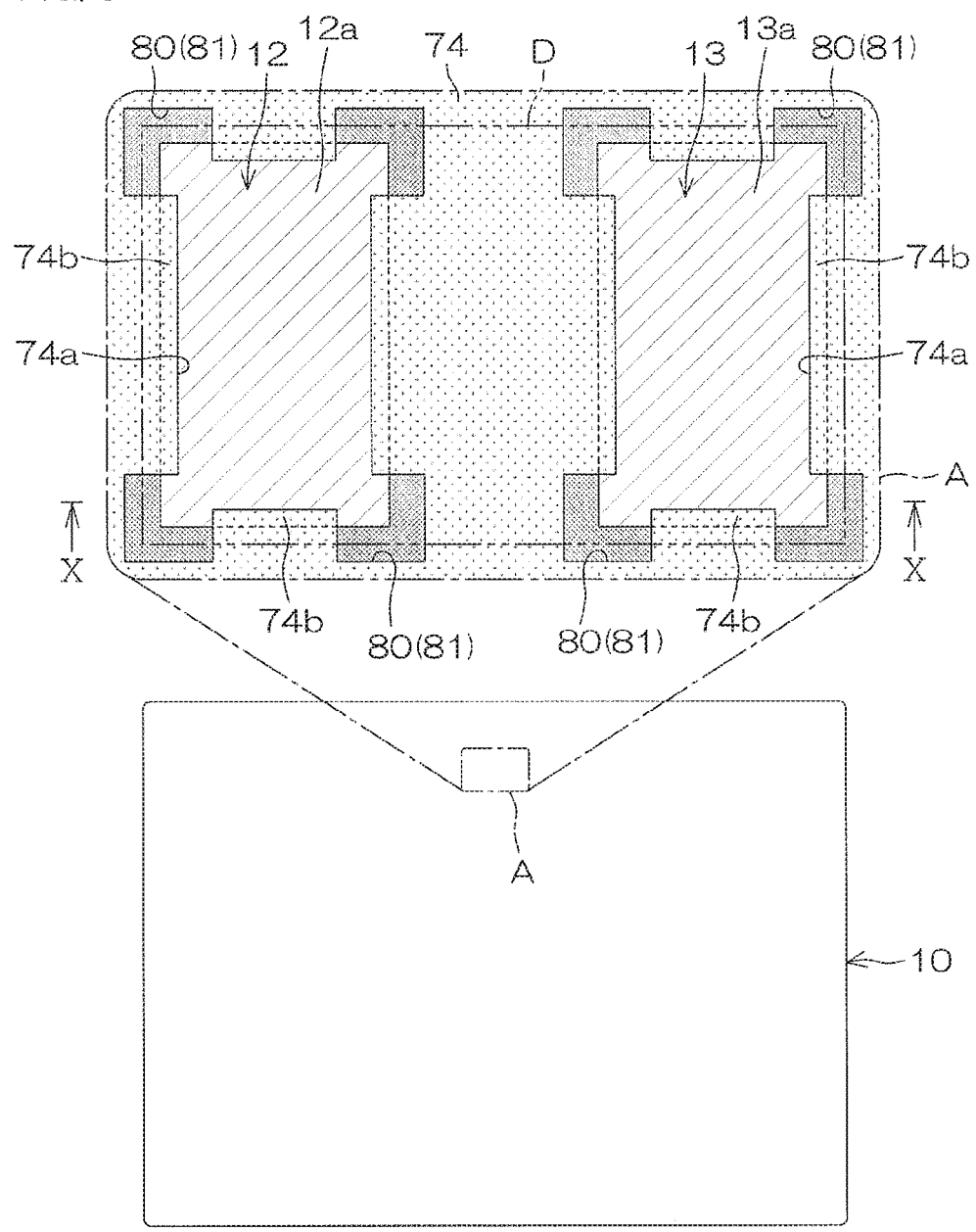
FIG. 9 is a plan view of a mounting substrate according to a third preferred embodiment of the present invention and shows a predetermined region of the mounting substrate in enlarged manner.
Figure 10:
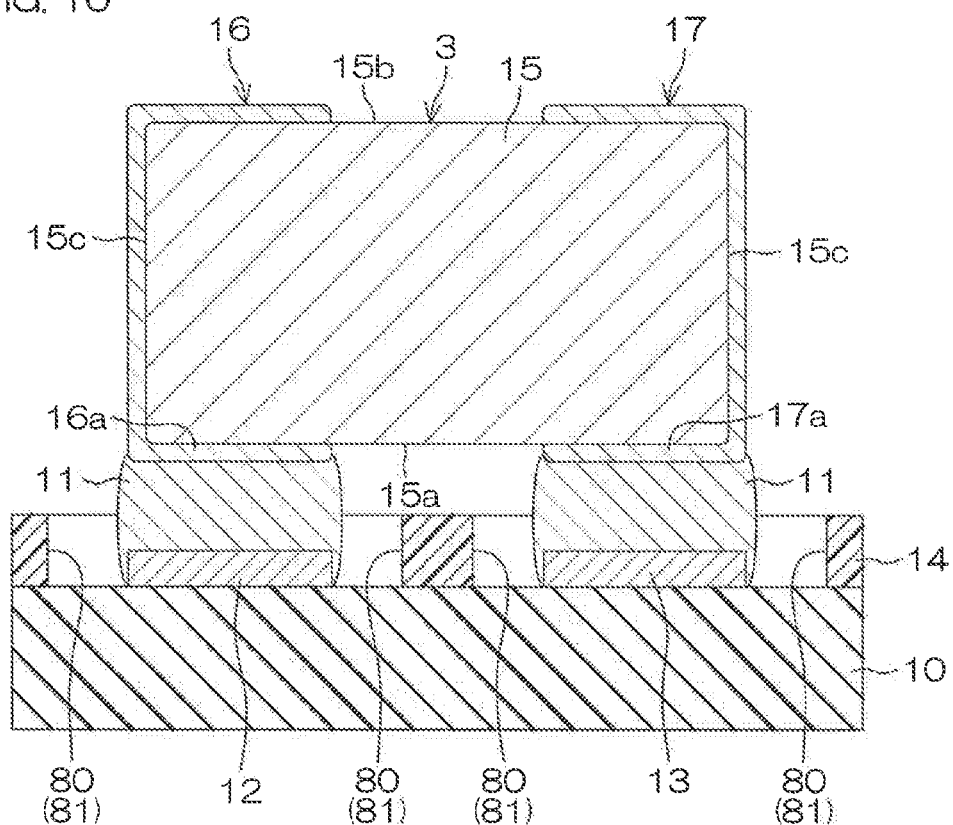
FIG. 10 is a vertical sectional view taken along line X-X shown in FIG. 9.

FIG. 9 is a plan view of a mounting substrate 71 according to a third preferred embodiment of the present invention and shows the predetermined region A of the mounting substrate 71 in enlarged manner. FIG. 10 is a vertical sectional view taken along line X-X shown in FIG. 9. A state where the electronic component 3 is not mounted on the mounting substrate 71 is shown in FIG. 9, and a state where the electronic component 3 is mounted on the mounting substrate 71 is shown in FIG. 10. In FIG. 9 and FIG. 10, arrangements that are the same as the arrangements illustrated with the first preferred embodiment described above are provided with the same reference symbols and description thereof shall be omitted.

The mounting substrate 71 according to the present preferred embodiment is a printed wiring board. The mounting substrate 71 according to the present preferred embodiment is provided as a mounted structure 72 by the electronic component 3 being mounted thereon. The mounted structure 72 is, for example, a printed circuit board or a printed circuit assembly.

The mounting substrate 71 includes the substrate 10 on which the mounting region D is set. The pair of connection electrodes 12 and 13 is formed on the substrate 10. A resist film 74 is formed on the front surface of the substrate 10. In FIG. 9, the resist film 74 is illustrated with hatching for the sake of clarity. The resist film 74 is a protective film arranged to protect the front surface of the substrate 10 and the wiring pattern. The resist film 74 is formed, for example, of an organic-based insulating material, such as a photosensitive resin or a thermosetting resin, etc.

Pad openings 74a, exposing inner regions of the respective connection electrodes 12 and 13 as the pad regions 12a and 13a, are formed in the resist film 74. The resist film 74 has cover portions 74b covering the peripheral edge portions of the respective connection electrodes 12 and 13. The resist film 74 is formed along side surfaces of the respective connection electrodes 12 and 13 from on the front surface of the substrate 10 and covers the upper surfaces of the respective connection electrodes 12 and 13. The cover portions 74b of the resist film 74 thus cover the respective connection electrodes 12 and 13 from four directions.

Referring to FIG. 10, the electronic component 3 is mounted in the mounting region D of the substrate 10. The one mounting electrode portion 16a (terminal electrode 16) is bonded via the conductive bonding material 11 to the one connection electrode 12. And the other mounting electrode portion 17a (terminal electrode 17) is bonded via the conductive bonding material 11 to the other connection electrode 13.

Referring to FIG. 9 and FIG. 10, one feature of the mounting substrate 71 according to the present preferred embodiment is that receiving portions 80 arranged to receive excess portions of the conductive bonding material 11 are formed in the resist film 74. The receiving portions 80 are also containment portions arranged to contain the excess portions of the conductive bonding material 11. The receiving portions 80 are formed by portions where the resist film 74 is removed so as to expose portions of the peripheral edge portions of the respective connection electrodes 12 and 13. The arrangement of the receiving portions 80 shall now be described in further detail.

With reference to FIG. 9, the receiving portion 80 formed at the connection electrode 12 side is formed to be in communication with the pad opening 74a at the one connection electrode 12 side. And the receiving portion 80 formed at the connection electrode 13 side is formed to be in communication with the pad opening 74a at the connection electrode 13 side. More specifically, the receiving portions 80 include recess portions 81 in communication with the pad openings 74a and receive and contain the excess portions of the conductive bonding material 11 that flow out from the upper surfaces of the respective connection electrodes 12 and 13 due to melting.

The receiving portions 80 are formed by selectively removing region covering outside a region between the pair of connection electrodes 12 and 13 in the resist film 74, in addition to the region covering between the pair of connection electrodes 12 and 13 in the resist film 74. The receiving portions 80 are formed by selectively removing portions covering the respective corner portions of the respective connection electrodes 12 and 13 in the resist film 74. In the present preferred embodiment, the receiving portions 80 are formed so as to expose each of corner portions (four corner portions) of the one connection electrode 12 singly and expose each of corner portions (four corner portions) of the other connection electrode 13 singly.

Referring to FIG. 10, the receiving portions 80 are formed to expose the front surface of the substrate 10. The conductive bonding material 11 includes portions positioned above exposed surfaces at which the front surface of the substrate 10 is exposed from the receiving portions 80. The conductive bonding material 11 covers the side surfaces of the respective connection electrodes 12 and 13 above the exposed surfaces of the substrate 10 in addition to the upper surfaces of the respective connection electrodes 12 and 13. The electronic component 3 is electrically and mechanically connected to the respective connection electrodes 12 and 13 via the conductive bonding material 11 positioned inside the receiving portions 80 and on the respective connection electrodes 12 and 13. The electrical and mechanical connections between the electronic component 3 and the respective connection electrodes 12 and 13 are thereby made satisfactory.

As in the arrangement shown in FIG. 3, each receiving portion 80 may include the thin resist film 28 covering the front surface of the substrate 10 at its bottom portion. In this case, the conductive bonding material 11 includes portions positioned above the resist films 28. The conductive bonding material 11 covers the side surfaces of the respective connection electrodes 12 and 13 above the resist films 28 in addition to the upper surfaces of the respective connection electrodes 12 and 13.

The electronic component 3 is electrically and mechanically connected to the respective connection electrodes 12 and 13 via the conductive bonding material 11 positioned inside the receiving portions 80 and on the respective connection electrodes 12 and 13. The electrical and mechanical connections between the electronic component 3 and the respective connection electrodes 12 and 13 are thereby made satisfactory.

As described above, in the mounting substrate 71 according to the present preferred embodiment, the excess portion of the conductive bonding material 11 can be contained by the receiving portions 80. Therefore, flowing out of a portion of the molten conductive bonding material 11 on the resist film 74 can be suppressed during mounting of the electronic component 3. Mounting of the electronic component 3 in a tilted orientation with respect to the front surface of the substrate 10 can thereby be suppressed. And also, formation of a chip-side ball at the periphery of the electronic component 3 can be suppressed. As a result, the mounting substrate 71 can be provided with which the electronic component 3 can be mounted in a satisfactory orientation and with which occurrence of a chip-side ball can be suppressed.

A case where a chip-side ball is formed in a space between the mounting surface 15a of the electronic component 3 and the resist film 74 in a structure where the receiving portions 80 are not present shall now be considered. In this case, there is a possibility that the electronic component 3 will be lifted by the chip-side ball formed in the space between the mounting surface 15a of the electronic component 3 and the resist film 74. The chip-side ball may become a cause of the electronic component 3 being mounted in a tilted orientation.

In contrast, in the mounting substrate 71 according to the present preferred embodiment, the receiving portions 80 are formed in the region covering between the pair of connection electrodes 12 and 13 in the resist film 74. Forming of a chip-side ball in the space between the mounting surface 15a of the electronic component 3 and the resist film 74 can thus be suppressed effectively. The mounting substrate 71 can thus be provided with which the electronic component 3 can be mounted in an even more satisfactory orientation.

Also in the mounting substrate 71 according to the present preferred embodiment, the receiving portions 80 are formed in the outside region covering outside the region between the pair of connection electrodes 12 and 13 in the resist film 74 in addition to the inside region covering between the pair of connection electrodes 12 and 13 in the resist film 74. The forming of a chip-side ball can thus be suppressed in the region covering outside the region between the pair of connection electrodes 12 and 13 in the resist film 74 as well. The mounting substrate 71 can thus be provided with which reliability can be improved further.

The mounting substrate 71 according to the present preferred embodiment can be manufactured by changing layouts of the respective masks used in the manufacturing process according to first preferred embodiment described above.

Although a plurality of preferred embodiments of the present invention have been described above, the present invention may be implemented in yet other forms.

Figure 11:
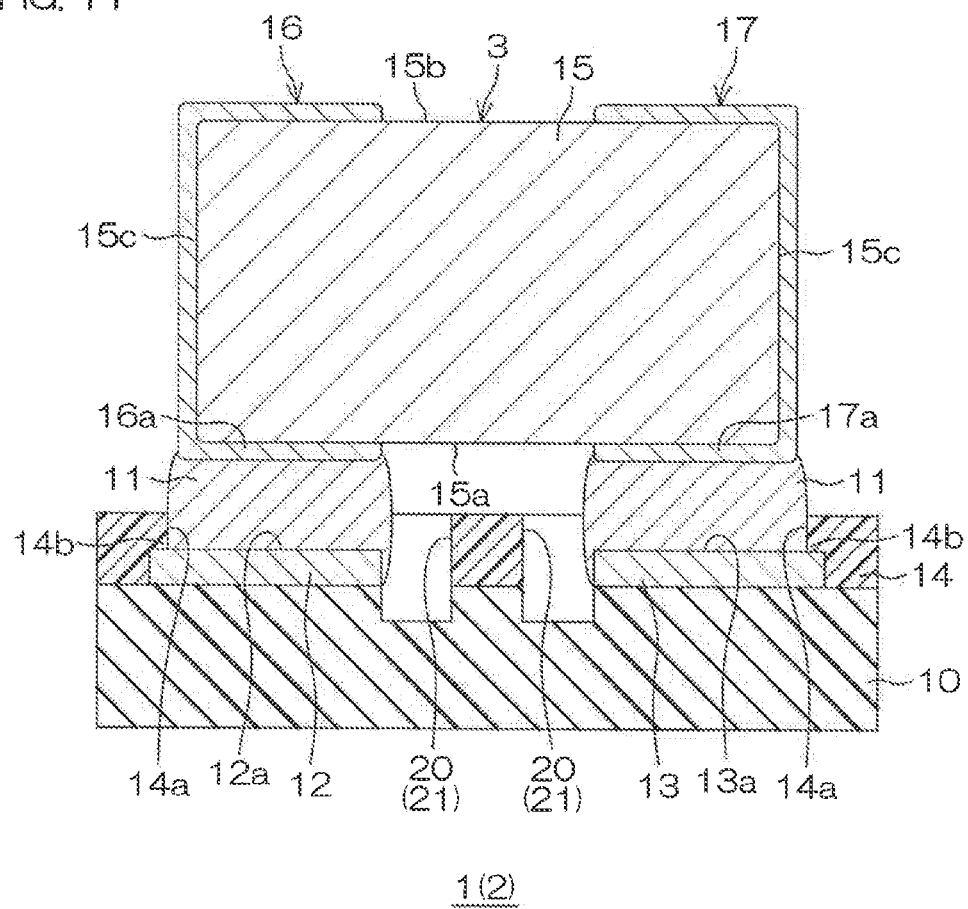
FIG. 11 is a vertical sectional view of a portion corresponding to FIG. 2 and is a diagram showing another example of receiving portions.

For example, although in the first preferred embodiment described above, an example where the receiving portions 20 are formed by removing portions of the resist film 14 is described, receiving portions 20 such as shown in FIG. 11 may be formed. FIG. 11 is a vertical sectional view of a portion corresponding to FIG. 2 and is a diagram showing another example of the receiving portions 20. In FIG. 11, arrangements that are the same as the arrangements illustrated with the first preferred embodiment described above are provided with the same reference symbols and description thereof shall be omitted.

The receiving portions 20 in the present example are formed by removing surface layer portions of the substrate 10 in addition to portions of the resist film 14. The same effects as those of the first preferred embodiment described above can be exhibited by such an arrangement. Obviously, the arrangement with which surface layer portions of the substrate 10 are removed in the receiving portions 20 may be applied to the respective arrangements of the second preferred embodiment and the third preferred embodiment.

Also in each of the respective preferred embodiments described above, an example where the receiving portions or portion 20, 50, or 80 are or is formed in the region covering between the pair of connection electrodes 12 and 13 in the resist film 14, 44, or 74 is described. However, the receiving portions or portion 20, 50, or 80 may be formed just in a region covering outside the region between the pair of connection electrodes 12 and 13 in the resist film 14, 44, or 74.

In a mounting substrate with such an arrangement, the forming of a chip-side ball can be suppressed in the region covering outside the region between the pair of connection electrodes 12 and 13 in the resist film 14, 44, or 74.

Also, in the mounting substrate 71 according to the third preferred embodiment described above, an example where the receiving portions 80 (recess portions 81) are formed in the region covering outside the region between the pair of connection electrodes 12 and 13 in the resist film 74 is described. However, as in the third preferred embodiment, in the mounting substrate 1 or 41 according to the first preferred embodiment or the second preferred embodiment, the receiving portions or portion 20 or 50 may be formed in the region covering outside the region between the pair of connection electrodes 12 and 13 as well.

Besides the above, various design changes may be applied within the scope of the matters described in the claims.

The present application corresponds to Japanese Patent Application No. 2015-235911 filed on Dec. 2, 2015 in the Japan Patent Office and the entire disclosure of this application is incorporated herein by reference.

While preferred embodiments of the present invention have been described in detail above, these are merely specific examples used to clarify the technical contents of the present invention, and the present invention should not be interpreted as being limited to these specific examples, and the scope of the present invention shall be limited only by the appended claims.

What is claimed is:

1. A mounting substrate comprising:
   a substrate having a front surface;
   a first connection electrode and a second connection electrode formed at an interval on the front surface of the substrate, and each having a facing surface facing each other across a facing region separating the facing surfaces of the first and second connection electrodes, and the first and second connection electrodes to be electrically connected to an electronic component;
   a resist film formed on the front surface of the substrate so as to cover a peripheral edge portion of the first connection electrode and a peripheral edge portion of the second connection electrode, and including an uneven portion formed in the facing region so as to selectively cover and expose the facing surfaces of the first and second connection electrodes and having different lengths in a facing direction of the first and second connection electrodes when viewed in plan;
   a first conductive bonding material arranged on the first connection electrode and to be connected to the electronic component;
   a second conductive bonding material arranged on the second connection electrode and to be connected to the electronic component; first recess portions each defined by the uneven portion of the resist film along the facing surface of the first connection electrode, and each receiving an excess portion of the first conductive bonding material that flows out from the first connection electrode due to melting flows; and
   second recess portions each defined by the uneven portion of the resist film along the facing surface of the second connection electrode, and each receiving an excess portion of the second conductive bonding material that flows out from the second connection electrode due to melting flows.

2. The mounting substrate according to claim 1, wherein the first conductive bonding material covers the facing surface of the first connection electrode in the first recess portions, and
   the second conductive bonding material covers the facing surface of the second connection electrode in the second recess portions.

3. The mounting substrate according to claim 1, wherein the first recess portions expose the front surface of the substrate, and
   the second recess portions expose the front surface of the substrate.

4. The mounting substrate according to claim 1, wherein the uneven portion of the resist film includes a first portion covering the facing surfaces of the first and second connection electrodes and having a first length in the facing direction, and a second portion exposing the facing surfaces of the first and second connection electrodes and having a second length less than the first length of the first portion in the facing direction.

5. The mounting substrate according to claim 1, wherein the second recess portions are formed line-symmetrically with respect to the first recess portions in regard to a line orthogonal to the facing direction when viewed in plan.

6. A mounted structure comprising:
   a substrate having a front surface;
   a first connection electrode and a second connection electrode formed at an interval on the front surface of the substrate and each having a facing surface facing each other across a facing region separating the facing surfaces of the first and second connection electrodes;
   a resist film formed on the front surface of the substrate so as to cover a peripheral edge portion of the first connection electrode and a peripheral edge portion of the second connection electrode, and including an uneven portion formed in the facing region so as to selectively cover and expose the facing surfaces of the first and second connection electrodes and having different lengths in a facing direction of the first and second connection electrodes when viewed in plan;
   an electronic component electrically connected to the first and second connection electrodes;
   a first conductive bonding material formed on the first connection electrode, and electrically and mechanically connected to the electronic component;
   a second conductive bonding material formed on the second connection electrode, and electrically and mechanically connected to the electronic component;
   first recess portions each defined by the uneven portion of the resist film along the facing surface of the first connection electrode, and each receiving an excess portion of the first conductive bonding material that flows out from the first connection electrode due to melting flows; and
   second recess portions each defined by the uneven portion of the resist film along the facing surface of the second connection electrode, and each receiving an excess portion of the second conductive bonding material that flows out from the second connection electrode due to melting flows.

7. The mounted structure according to claim 6, wherein the first conductive bonding material covers the facing surface of the first connection electrode in the first recess portions, and the second conductive bonding material covers the facing surface of the second connection electrode in the second recess portions.

8. The mounted structure according to claim 6, wherein the first recess portions expose the front surface of the substrate, and the second recess portions expose the front surface of the substrate.

9. The mounted structure according to claim 6, wherein the uneven portion of the resist film includes a first portion covering the facing surfaces of the first and second connection electrodes and having a first length in the facing direction, and a second portion exposing the facing surfaces of the first and second connection electrodes and having a second length less than the first length of the first portion in the facing direction.

10. The mounting structure according to claim 6, wherein the second recess portions are formed line-symmetrically with respect to the first recess portions in regard to a line orthogonal to the facing direction when viewed in plan.

* * * * *